(12) United States Patent
Huang

(10) Patent No.: US 10,256,242 B2
(45) Date of Patent: Apr. 9, 2019

(54) MEMORY CIRCUIT WITH THYRISTOR

(71) Applicant: Etron Technology, Inc., Hsinchu (TW)

(72) Inventor: Li-Ping Huang, Taipei (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 15/841,252

(22) Filed: Dec. 13, 2017

(65) Prior Publication Data

US 2018/0166445 A1    Jun. 14, 2018

Related U.S. Application Data

(60) Provisional application No. 62/433,738, filed on Dec. 13, 2016.

(51) Int. Cl.

| H01L 27/105 | (2006.01) |
|---|---|
| H01L 29/06 | (2006.01) |
| H01L 27/102 | (2006.01) |
| H01L 29/423 | (2006.01) |
| H01L 27/12 | (2006.01) |
| H01L 29/745 | (2006.01) |
| H01L 29/78 | (2006.01) |
| H01L 29/74 | (2006.01) |

(52) U.S. Cl.
CPC ........ *H01L 27/1027* (2013.01); *H01L 27/102* (2013.01); *H01L 27/105* (2013.01); *H01L 27/1052* (2013.01); *H01L 29/06* (2013.01); *H01L 29/068* (2013.01); *H01L 29/0673* (2013.01); *H01L 29/423* (2013.01); *H01L 27/1211* (2013.01); *H01L 29/42308* (2013.01); *H01L 29/42392* (2013.01); *H01L 29/742* (2013.01); *H01L 29/7436* (2013.01); *H01L 29/7455* (2013.01); *H01L 29/7853* (2013.01)

(58) Field of Classification Search
CPC ..... H01L 29/423; H01L 27/105; H01L 29/06; H01L 27/1027; H01L 27/1052; H01L 29/0673; H01L 29/068; H01L 27/102; H01L 29/7436; H01L 29/42392
USPC ........ 438/135, 133, 197; 257/107, 133, 138, 257/153, 392, E27.099, E21.703; 365/163, 222

See application file for complete search history.

(56) References Cited

U.S. PATENT DOCUMENTS

| 6,413,802 B1 * | 7/2002 | Hu ................. H01L 21/845 438/151 |
|---|---|---|
| 6,897,111 B2 * | 5/2005 | Quek ................. H01L 21/84 257/348 |
| 7,381,999 B1 * | 6/2008 | Yang ................. H01L 27/1027 257/133 |
| 8,093,107 B1 * | 1/2012 | Nemati ................. G11C 11/39 257/E21.388 |
| 2003/0227790 A1 * | 12/2003 | Marr ................. G11C 11/39 365/105 |

(Continued)

FOREIGN PATENT DOCUMENTS

TW    200428569    12/2004

*Primary Examiner* — Thinh T Nguyen
(74) *Attorney, Agent, or Firm* — Winston Hsu

(57) ABSTRACT

A memory circuit with thyristor includes a plurality of memory cells. Each memory cell of the plurality of memory cells includes an access transistor and a thyristor. The thyristor is coupled to the access transistor. At least one of a gate of the access transistor and a gate of the thyristor has a fin structure.

17 Claims, 3 Drawing Sheets

(56) References Cited

U.S. PATENT DOCUMENTS

| | | | |
|---|---|---|---|
| 2005/0026343 A1* | 2/2005 | Quek | H01L 21/84 438/197 |
| 2007/0012945 A1 | 1/2007 | Sugizaki | |
| 2011/0074498 A1* | 3/2011 | Thompson | H01L 21/823412 327/543 |

* cited by examiner

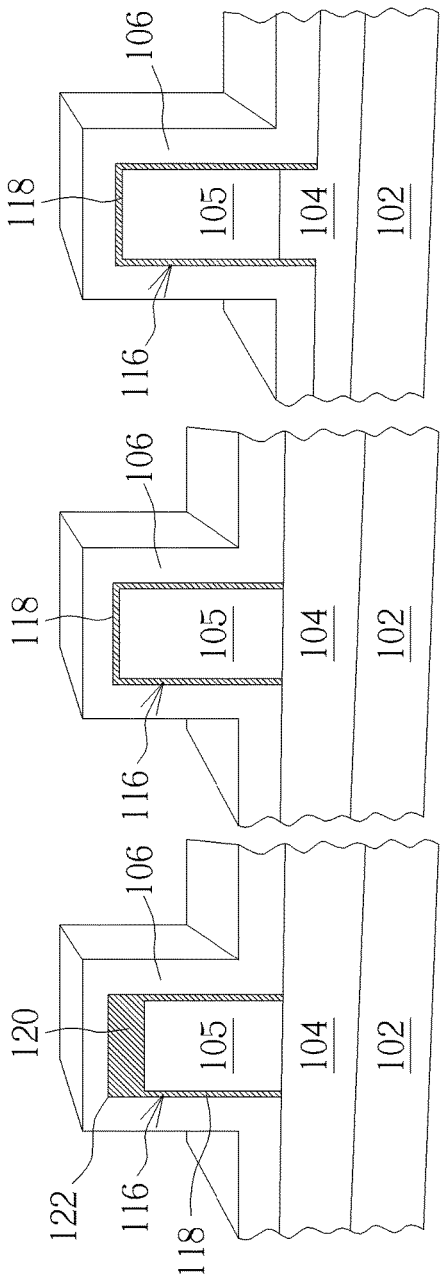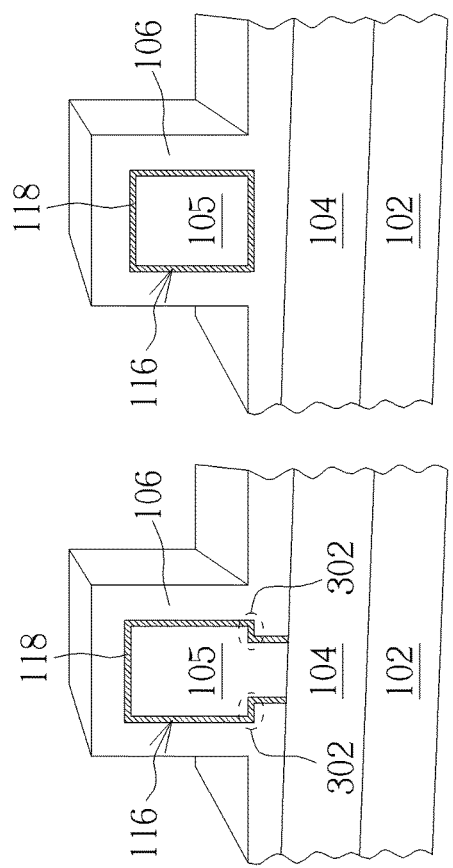

MEMORY CIRCUIT WITH THYRISTOR

CROSS REFERENCE TO RELATED APPLICATIONS

This application claims the benefit of U.S. Provisional Application No. 62/433,738, filed on Dec. 13, 2016 and entitled "Thyristor Based Memory and its Method of Operation," the contents of which are incorporated herein by reference.

BACKGROUND OF THE INVENTION

1. Field of the Invention

The present invention relates to a memory circuit with thyristor, and particularly to a memory circuit with thyristor that has a fin structure.

2. Description of the Prior Art

Although a memory circuit with thyristor has greater conduction current (higher writing speed) and less leakage current (lower standby current), a yield of the memory circuit is generally not high because the thyristor has a stacked structure. To solve a problem of low yield of the memory circuit, the prior art provides a planar thyristor, but the planar thyristor is difficult to shrink, resulting in the planar thyristor failing to be imported into a high-end semiconductor process. Therefore, how to make the planar thyristor be imported into the high-end semiconductor process becomes an important issue of a designer of the memory circuit.

SUMMARY OF THE INVENTION

An embodiment of the present invention provides a memory circuit with thyristor. The memory circuit includes a plurality of memory cells. Each memory cell of the plurality of memory cells includes an access transistor and a thyristor. The thyristor is coupled to the access transistor. At least one of a gate of the access transistor and a gate of the thyristor has a fin structure.

Another embodiment of the present invention provides a memory circuit with thyristor. The memory circuit includes a silicon-on-insulator (SOI) structure layer and a plurality of memory cells. The plurality of memory cells are formed on the SOI structure layer, wherein each memory cell of the plurality of memory cells includes an access transistor and a thyristor. The access transistor is composed of a first strip semiconductor material and a gate of the access transistor, wherein the first strip semiconductor material is formed along a first direction on the SOI structure layer, and the gate of the access transistor is formed along a second direction on the SOI structure layer and covers the first strip semiconductor material. The thyristor is composed of a second strip semiconductor material and a gate of the thyristor, wherein the second strip semiconductor material is formed along the first direction on the SOI structure layer, and the gate of the thyristor is formed along the second direction and covers the second strip semiconductor material. The gate of the access transistor surrounds at least three sides of the first strip semiconductor material, or the gate of the thyristor surrounds at least three sides of the second strip semiconductor material.

The present invention provides a memory circuit with thyristor. In the memory circuit, because at least one of a gate of an access transistor of the memory circuit and a gate of a thyristor of the memory circuit has a fin structure, compared to the prior art, the present invention can shrink the memory circuit very easily to import the memory circuit into a high-end semiconductor process. In addition, because the at least one of the gate of the access transistor and the gate of the thyristor has the fin structure, the present invention can make the access transistor and the thyristor have greater conduction current when the access transistor and the thyristor are turned on, and the present invention can also make the access transistor and the thyristor have less leakage current when the access transistor and the thyristor are turned off because control efficiency of the gate and control efficiency of the gate are good and the access transistor and the thyristor are formed on a silicon-on-insulator (SOI) structure layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3A-3E are diagram illustrating various fin structures of the access transistor.

DETAILED DESCRIPTION

Figure 1:
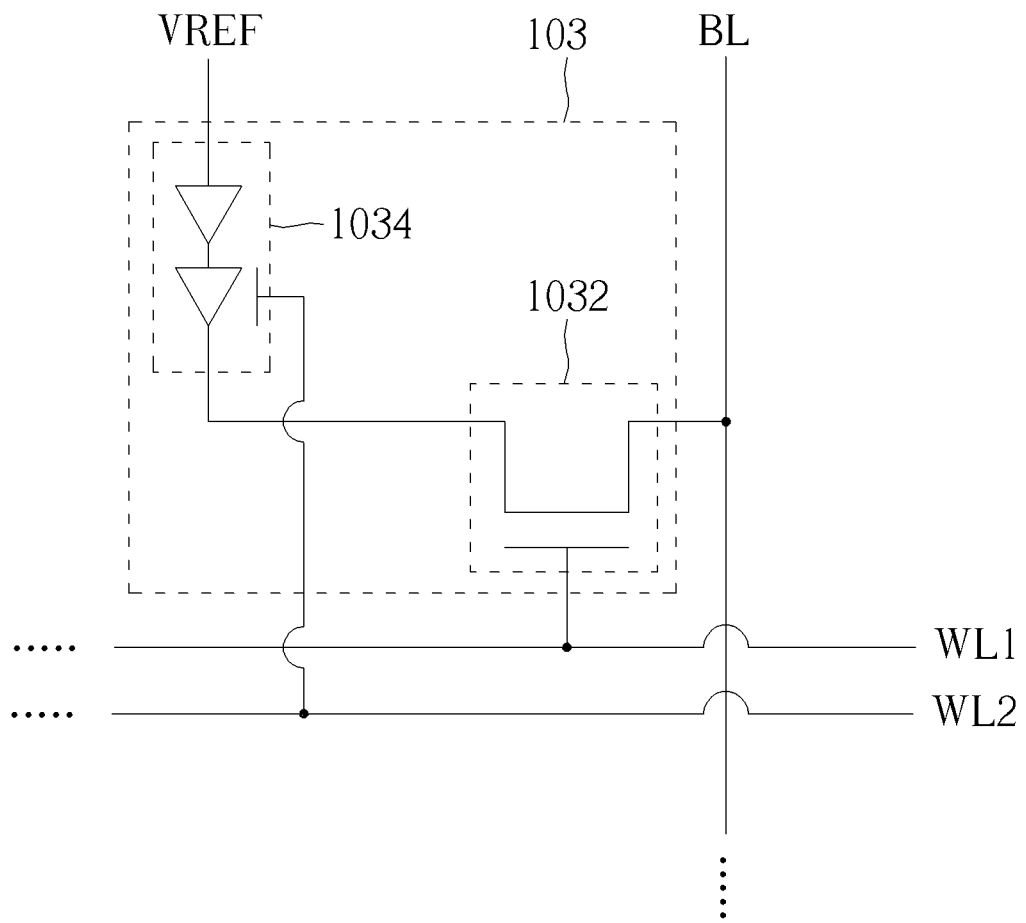
FIG. 1 is a diagram illustrating a memory circuit with thyristor according to an embodiment of the present invention.

Please refer to FIG. 1. FIG. 1 is a diagram illustrating a memory circuit 100 with thyristor according to an embodiment of the present invention, wherein the memory circuit 100 includes a plurality of memory cells. In addition, FIG. 1 only shows a memory cell 103 of the plurality of memory cells and a first word line WL1, a second word line WL2, and a bit line BL included in the memory circuit 100 coupled to the memory cell 103. As shown in FIG. 1, the memory cell 103 includes an access transistor 1032 and a thyristor 1034, wherein the thyristor 1034 is used for storing data, and the access transistor 1032 accesses data stored in the thyristor 1034. In addition, when the first word line WL1 and the second word line WL2 are enabled, the thyristor 1034 can be written into logic "1", when the first word line WL1, the second word line WL2, and the bit line BL are enabled, the thyristor 1034 can be written into logic "0", when the first word line WL1 and the bit line BL are enabled, the bit line BL can read logic "1" from the thyristor 1034 through the access transistor 1032, and when only the first word line WL1 is enabled, the bit line BL can read logic "0" from the thyristor 1034 through the access transistor 1032. In addition, subsequent operational principles of the thyristor 1034 and the access transistor 1032 are obvious to those of ordinary skill in the art, so further description thereof is omitted for simplicity.

Figure 2:
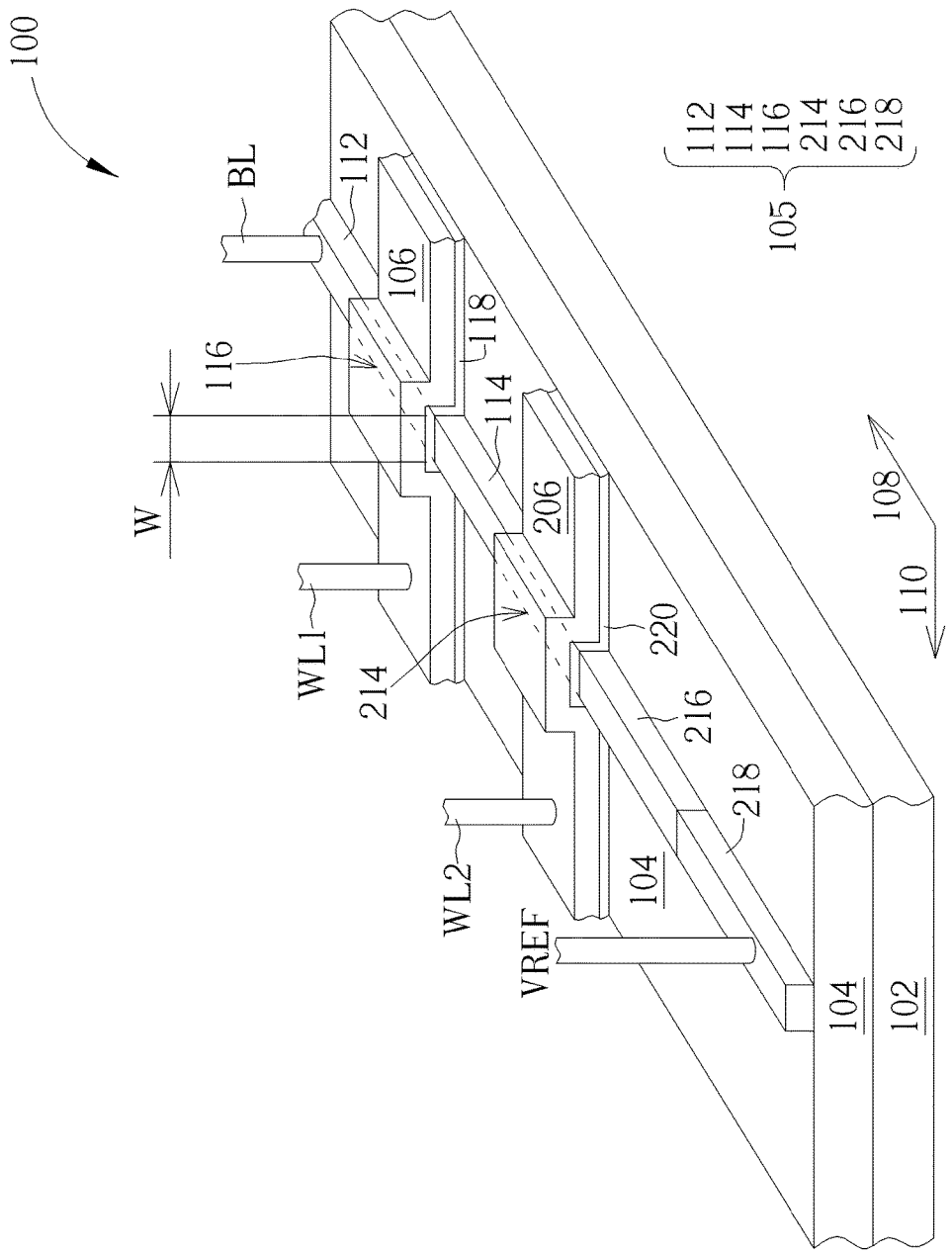
FIG. 2 is a diagram illustrating a structure of the memory circuit.

Please refer to FIG. 2. FIG. 2 is a diagram illustrating a structure of the memory circuit 100. As shown in FIG. 2, a strip semiconductor material 105 is formed along a first direction 108 on a silicon-on-insulator (SOI) structure layer, and a gate 106 of the access transistor 1032 is formed along a second direction 110 on the SOI structure layer and covers the strip semiconductor material 105, wherein the first direction 108 is not parallel to the second direction 110 (e.g.

the first direction 108 can be perpendicular to the second direction 110, or the first direction 108 and the second direction 110 can intersect). In addition, a gate 206 of the thyristor 1034 is also formed along the second direction 110 on the SOI structure layer and also covers the strip semiconductor material 105.

In addition, in another embodiment of the present invention, the access transistor 1032 is composed of a first strip semiconductor material and the gate 106 of the access transistor 1032, wherein the first strip semiconductor material is formed along the first direction 108 on the SOI structure layer, and the gate 106 of the access transistor 1032 is formed along the second direction 110 on the SOI structure layer and covers the first strip semiconductor material; the thyristor 1034 is composed of a second strip semiconductor material and the gate 206 of the thyristor 1034, wherein the second strip semiconductor material is formed along the first direction 108 on the SOI structure layer, and the gate 206 of the thyristor 1034 transistor is formed along the second direction 110 on the SOI structure layer and covers the second strip semiconductor material; wherein the first strip semiconductor material and the second strip semiconductor material are different parts of a same semiconductor material. But, in another embodiment of the present invention, an end of the first strip semiconductor material is electrically connected to an end of the second strip semiconductor material. For example, the end of the first strip semiconductor material is electrically connected to the end of the second strip semiconductor material through a contact or a via.

As shown in FIG. 2, the gate 106 and the gate 206 divide the strip semiconductor material 105 into a first N-type doping region 112, a first channel 116, a second N-type doping region 114, a second channel 214, and a third N-type doping region 216, wherein the first N-type doping region 112 is a drain of the access transistor 1032 and the second N-type doping region 114 is a source of the access transistor 1032. That is to say, the first N-type doping region 112 (the drain of the access transistor 1032), the second N-type doping region 114 (the source of the access transistor 1032), and the gate 106 form the access transistor 1032. As shown in FIG. 2, the second N-type doping region 114 further acts as a cathode of the thyristor 1034, and a P-type doping region 218 further included in the strip semiconductor material 105 is coupled to the third N-type doping region 216, wherein the P-type doping region 218 acts as an anode of the thyristor 1034, and the anode of the thyristor 1034 is used for receiving a reference voltage VREF. That is to say, the second N-type doping region 114, the second channel 214, the third N-type doping region 216, the P-type doping region 218, and the gate 206 form the thyristor 1034. In addition, as shown in FIG. 2, the first word line WL1 is electrically connected to the gate 106 of the access transistor 1032, the second word line WL2 is electrically connected to the gate 206 of the thyristor 1034, and the bit line BL is electrically connected to the first N-type doping region 112.

In addition, the access transistor 1032 and the thyristor 1034 are formed on the SOI structure layer, wherein the SOI structure layer includes a substrate 102 and an insulation layer 104, and the insulation layer 104 is formed on the substrate 102 for preventing from leakage current of the access transistor 1032 and thyristor 1034. In addition, in one embodiment of the present invention, the substrate 102 includes at least one of a conductive silicon substrate and an insulating silicon substrate, and the insulation layer 104 is an oxide layer.

As shown in FIG. 2, the gate 106 of the access transistor 1032 has a fin structure, that is, the gate 106 of the access transistor 1032 surrounds at least three sides of the strip semiconductor material 105. For example, the fin structure of the gate 106 can be an ordinary fin structure (as shown in FIG. 3A), a tri-gate fin structure (as shown in FIG. 3B), a n-gate fin structure (as shown in FIG. 3C), an Ω-gate fin structure (as shown in FIG. 3D), or a gate-all-around (GAA) gate fin structure (as shown in FIG. 3E). As shown in FIG. 3A, a first oxide layer 118 between the gate 106 and the strip semiconductor material 105 can form a thicker dielectric zone 120 to reduce stress and electric field of a corner 122, wherein the first oxide layer 118 can be hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), or a combination of the above mentioned dielectric materials. As shown in FIG. 3C, because the gate 106 not only crosses the strip semiconductor material 105, but also crosses apart of the insulation layer 104, the fin structure shown in FIG. 3C can simultaneously have different thresholds. In addition, the fin structure shown in FIG. 3D utilizes a corner 302 to increase a surrounding area between the gate 106 and the strip semiconductor material 105, and the fin structure shown in FIG. 3E utilizes the gate 106 to surround four sides of the strip semiconductor material 105 to increase the surrounding area between the gate 106 and the strip semiconductor material 105.

In addition, in the first channel region 116 controlled by the gate 106, the less width of the gate 106 is, the better conduction capability of the access transistor 1032 will be, but the leakage current of the access transistor 1032 is more difficult to suppress. Therefore, the present invention utilizes the fin structures shown in FIGS. 3A-3E to increase the surrounding area between the gate 106 and the strip semiconductor material 105 to increase control efficiency of the gate 106. Therefore, in FIGS. 3A-3E, the gate 106 not only can control the first channel region 116 of the strip semiconductor material 105 more flexibly, but can also reduce width W (as shown in FIG. 2) of the first channel region 116 more effectively. In addition, in one embodiment of the present invention, because the gate 106 is a metal gate, the metal gate can also increase the control efficiency of the gate 106.

In addition, as shown in FIG. 2, the gate 206 of the thyristor 1034 also has a fin structure, and an implement method of the fin structure of the gate 206 can be referred to FIGS. 3A-3E, so further description thereof is omitted for simplicity. In addition, a second oxide layer 220 exists between the gate 206 and the strip semiconductor material 105, wherein the second oxide layer 220 can also be hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), or a combination of the above mentioned dielectric materials. In addition, the strip semiconductor material 105 can be a monocrystalline silicon material or a polysilicon material.

Because both the gate 106 of the access transistor 1032 and the gate 206 of the thyristor 1034 have the fin structure, the present invention can shrink the memory circuit 100 very easily to import the memory circuit 100 into a high-end semiconductor process (e.g. 5 nanometer semiconductor process or 3 nanometer semiconductor process). In addition, because both the gate 106 of the access transistor 1032 and the gate 206 of the thyristor 1034 have the fin structure, the present invention can make the access transistor 1032 and the thyristor 1034 have greater conduction current when the access transistor 1032 and the thyristor 1034 are turned on, and the present invention can also make the access transistor 1032 and the thyristor 1034 have less leakage current when the access transistor 1032 and the thyristor 1034 are turned off because the control efficiency of the gate 106 and the control efficiency of the gate 206 are good and the access transistor 1032 and the thyristor 1034 are formed on the SOI structure layer. In addition, other advantages of the memory circuit 100 (e.g. not needing refresh and easily implemented by a traditional complementary metal-oxide-semiconductor (MOS) transistor process) are obvious to those of ordinary skill in the art, so further description thereof is omitted for simplicity.

In addition, in another embodiment of the present invention, at least one of the gate 106 of the access transistor 1032 and the gate 206 of the thyristor 1034 has the fin structure, that is, the gate 106 of the access transistor 1032 has the fin structure, or the gate 206 of the thyristor 1034 has the fin structure, or both the gate 106 of the access transistor 1032 and the gate 206 of the thyristor 1034 have the fin structure.

To sum up, in the memory circuit, because at least one of the gate of the access transistor and the gate of the thyristor has the fin structure, compared to the prior art, the present invention can shrink the memory circuit very easily to import the memory circuit into the high-end semiconductor process. In addition, because the at least one of the gate of the access transistor and the gate of the thyristor has the fin structure, the present invention can make the access transistor and the thyristor have greater conduction current when the access transistor and the thyristor are turned on, and the present invention can also make the access transistor and the thyristor have less leakage current when the access transistor and the thyristor are turned off because the control efficiency of the gate and the control efficiency of the gate are good and the access transistor and the thyristor are formed on the SOI structure layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory circuit with thyristor, comprising:
    a plurality of memory cells, wherein each memory cell of the plurality of memory cells comprises:
        an access transistor; and
        a thyristor coupled to the access transistor;
    wherein at least one of a gate of the access transistor and a gate of the thyristor has a fin structure, and a dielectric zone corresponding to at least one side of at least three sides of a strip semiconductor material surrounded by the fin structure is thicker than dielectric zones corresponding to other sides of the at least three sides of the strip semiconductor material.

2. The memory circuit of claim 1, wherein the access transistor accesses data stored in the thyristor.

3. The memory circuit of claim 1, wherein the access transistor and the thyristor are formed on a silicon-on-insulator (SOI) structure layer.

4. The memory circuit of claim 3, wherein the access transistor is composed of the strip semiconductor material and the gate of the access transistor, the strip semiconductor material is formed along a first direction on the SOI structure layer, and the gate of the access transistor is formed along a second direction on the SOI structure layer and crosses the strip semiconductor material.

5. The memory circuit of claim 4, wherein the first direction is not parallel to the second direction.

6. The memory circuit of claim 4, wherein the strip semiconductor material is a P-type silicon material.

7. A memory circuit with thyristor, comprising:
    a plurality of memory cells, wherein each memory cell of the plurality of memory cells comprises:
        an access transistor; and
        a thyristor coupled to the access transistor;
    wherein at least one of a gate of the access transistor and a gate of the thyristor has a fin structure, and at least four sides of a strip semiconductor material are surrounded by the fin structure.

8. The memory circuit of claim 4, wherein the thyristor is composed of the strip semiconductor material and the gate of the thyristor, and the gate of the thyristor is formed along the second direction and covers the strip semiconductor material.

9. The memory circuit of claim 4, wherein the gate of the access transistor and the gate of the thyristor divide the strip semiconductor material into a first N-type doping region, a first channel, a second N-type doping region, a second channel, and a third N-type doping region, wherein the strip semiconductor material further comprises a P-type doping region coupled to the third N-type doping region.

10. The memory circuit of claim 9, wherein a bit line is electrically connected to the first N-type doping region, a first word line is electrically connected to the gate of the access transistor, and a second word line is electrically connected to the gate of the thyristor, wherein the P-type doping region receives a reference voltage.

11. The memory circuit of claim 3, wherein the SOI structure layer comprises a substrate, and the substrate comprises at least one of a conductive silicon substrate and an insulating silicon substrate.

12. The memory circuit of claim 1, wherein the fin structure is an ordinary fin structure, a tri-gate fin structure, a it-gate fin structure, an Ω-gate fin structure, or a gate-all-around (GAA) gate fin structure.

13. The memory circuit of claim 3, wherein the access transistor is composed of a first strip semiconductor material and the gate of the access transistor, the first strip semiconductor material is formed along a first direction on the SOI structure layer, and the gate of the access transistor is formed along a second direction on the SOI structure layer and covers the first strip semiconductor material, wherein the thyristor is composed of a second strip semiconductor material and the gate of the thyristor, the second strip semiconductor material is formed along the first direction on the SOI structure layer, and the gate of the access transistor is formed along the second direction on the SOI structure layer and covers the second strip semiconductor material.

14. A memory circuit with thyristor, comprising:
    a silicon-on-insulator (SOI) structure layer; and
    a plurality of memory cells formed on the SOI structure layer, wherein each memory cell of the plurality of memory cells comprises:
        an access transistor composed of a first strip semiconductor material and a gate of the access transistor, wherein the first strip semiconductor material is formed along a first direction on the SOI structure layer, and the gate of the access transistor is formed along a second direction on the SOI structure layer and covers the first strip semiconductor material; and
        a thyristor composed of a second strip semiconductor material and a gate of the thyristor, wherein the second strip semiconductor material is formed along the first direction on the SOI structure layer, and the gate of the thyristor is formed along the second direction and covers the second strip semiconductor material;

wherein the gate of the access transistor surrounds at least three sides of the first strip semiconductor material, or the gate of the thyristor surrounds at least three sides of the second strip semiconductor material;

wherein a dielectric zone corresponding to at least one side of the at least three sides of the first strip semiconductor material is thicker than dielectric zones corresponding to other sides of the at least three sides of the first strip semiconductor material, and a dielectric zone corresponding to at least one side of the at least three sides of the second strip semiconductor material is thicker than dielectric zones corresponding to other sides of the at least three sides of the second strip semiconductor material.

15. The memory circuit of claim 14, wherein the first strip semiconductor material is electrically connected to the second strip semiconductor material.

16. The memory circuit of claim 14, wherein the SOI structure layer comprises a substrate, and the substrate comprises at least one of a conductive silicon substrate and an insulating silicon substrate.

17. The memory circuit of claim 14, wherein the gate of the access transistor surrounds the at least four sides of the first strip semiconductor material, and the gate of the thyristor surrounds the at least three four of the second strip semiconductor material.

* * * * *